(12) United States Patent
Al-Amoody et al.

(10) Patent No.: US 9,673,301 B1
(45) Date of Patent: Jun. 6, 2017

(54) METHODS OF FORMING SPACERS ON FINFET DEVICES

(71) Applicant: GLOBALFOUNDRIES Inc., Grand Cayman (KY)

(72) Inventors: Fuad Al-Amoody, Rexford, NY (US); Jinping Liu, Ballston Lake, NY (US); Haifeng Sheng, Rexford, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/047,018

(22) Filed: Feb. 18, 2016

(51) Int. Cl.
*H01L 29/66* (2006.01)
*H01L 21/311* (2006.01)
*H01L 21/3115* (2006.01)
*H01L 21/223* (2006.01)

(52) U.S. Cl.
CPC .... *H01L 29/66795* (2013.01); *H01L 21/2236* (2013.01); *H01L 21/3115* (2013.01); *H01L 21/31111* (2013.01); *H01L 21/31144* (2013.01); *H01L 21/31155* (2013.01)

(58) Field of Classification Search
CPC .......................... H01L 29/785; H01L 27/1211
See application file for complete search history.

(56) References Cited

U.S. PATENT DOCUMENTS 6,951,784 B1 * 10/2005 Anderson ............. H01L 29/785
438/157

* cited by examiner

*Primary Examiner* — Mohammad Choudhry
(74) *Attorney, Agent, or Firm* — Amerson Law Firm, PLLC

(57) ABSTRACT

One illustrative method disclosed herein includes forming a liner layer above a layer of spacer material, forming an ion-containing region in at least a portion of a first portion of the liner layer while not forming the ion-containing region in a second portion of the liner layer, performing a liner etching process on the first and second portions of the liner layer so as to remove the second portion of the liner layer while leaving at least a portion of the first portion of the liner layer positioned adjacent a gate structure and, with the first portion of the liner layer positioned adjacent the gate structure, performing at least one spacer formation anisotropic etching process on the layer of spacer material so as to define a spacer adjacent the gate structure.

24 Claims, 14 Drawing Sheets

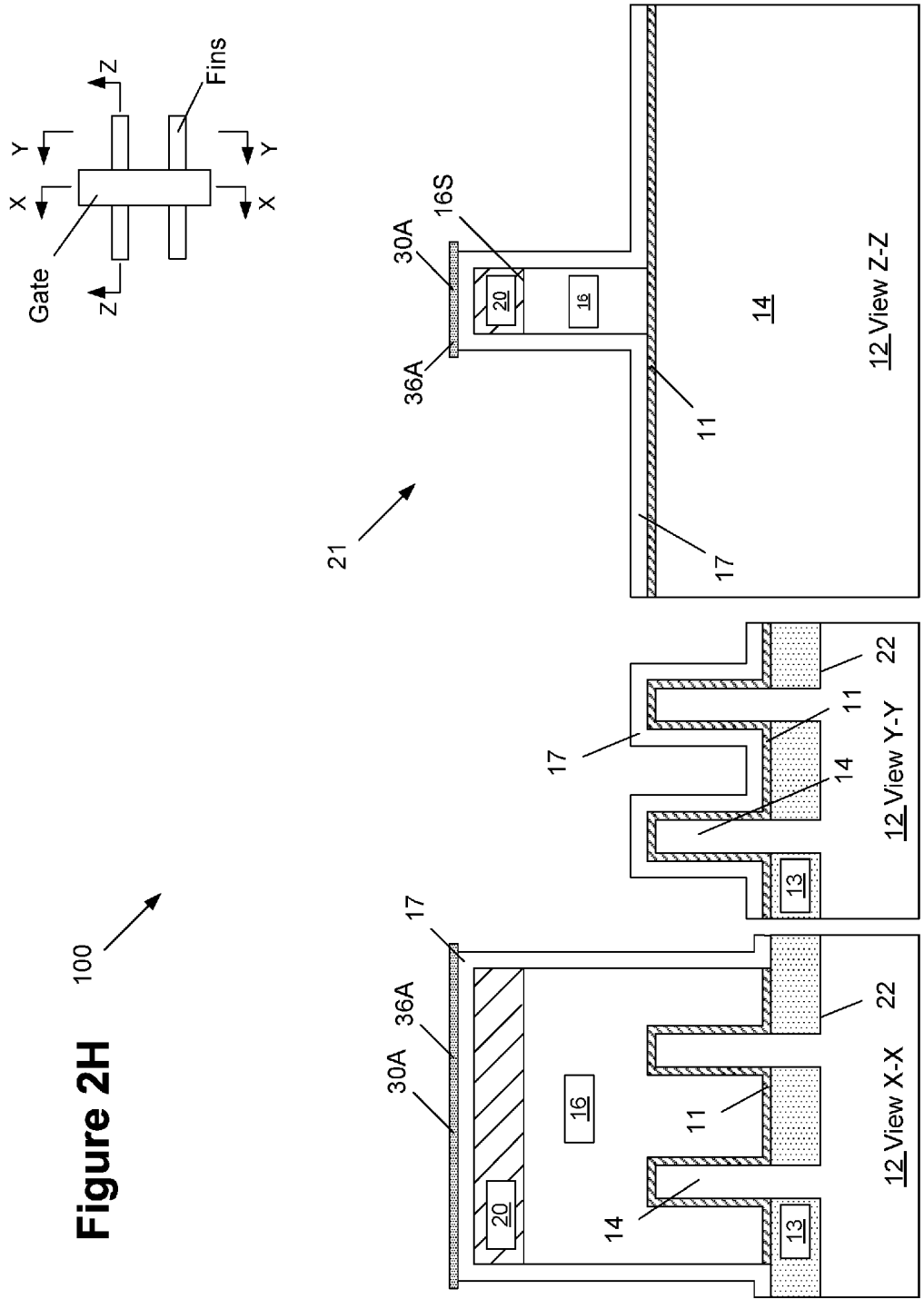

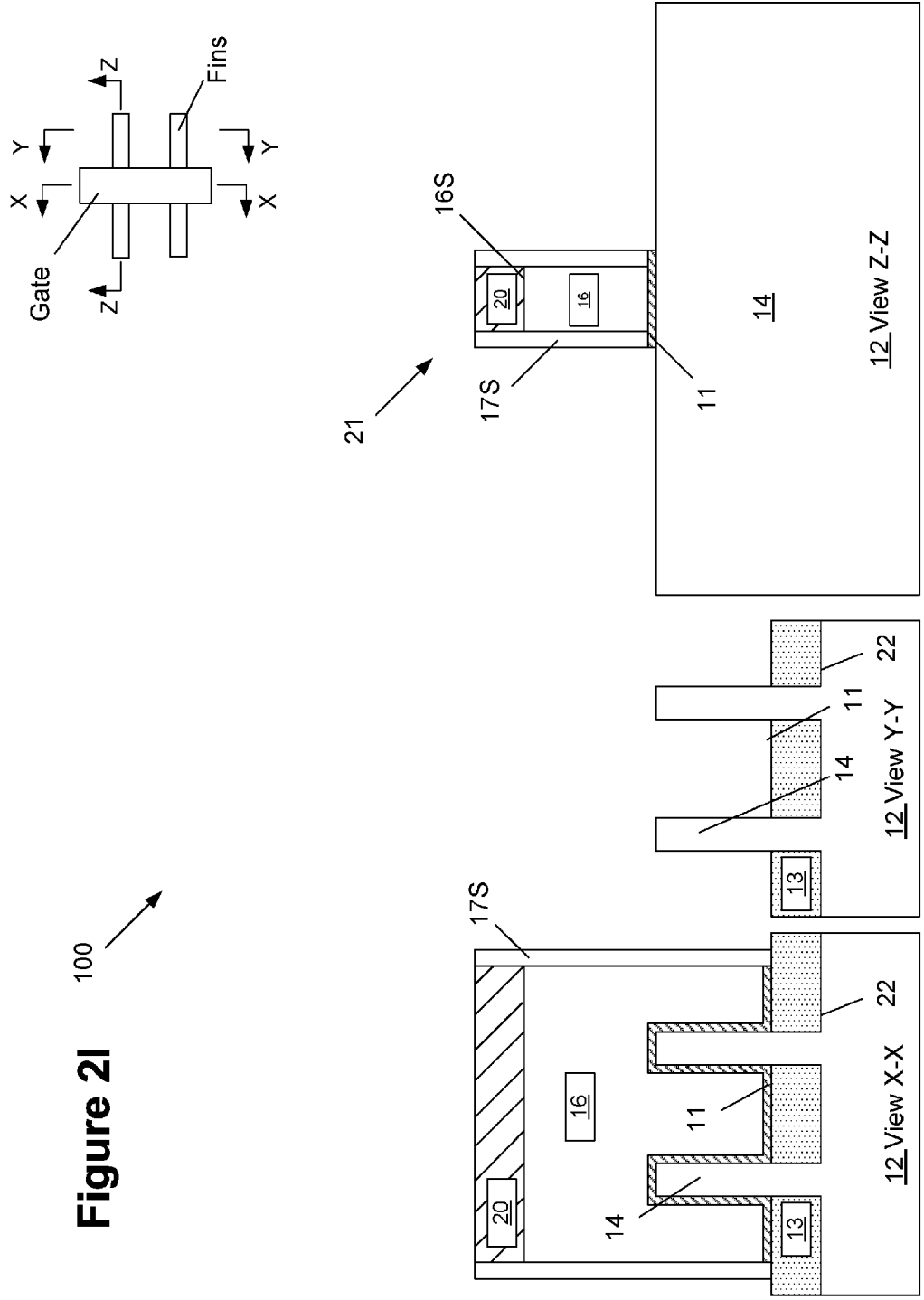

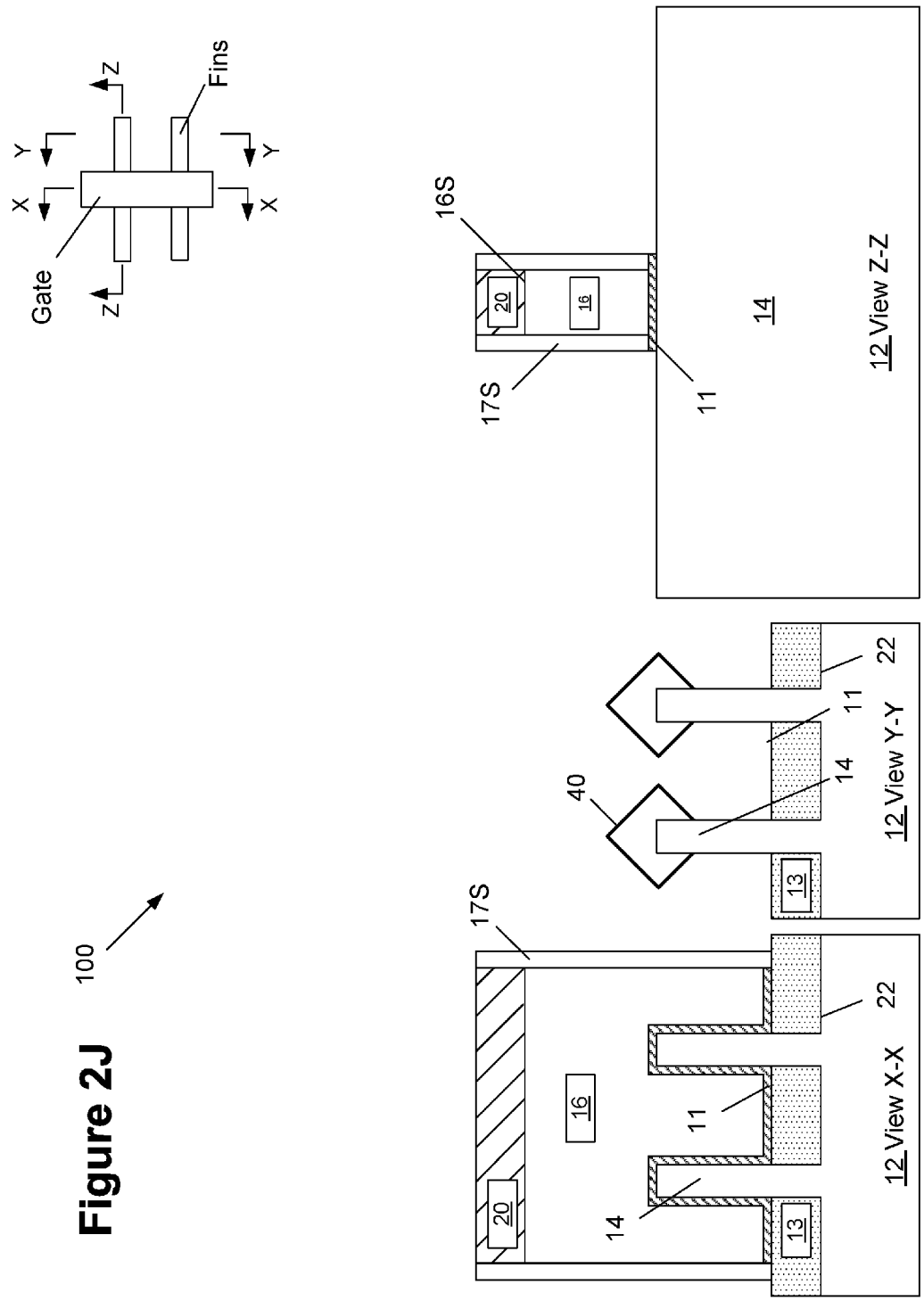

METHODS OF FORMING SPACERS ON FINFET DEVICES

BACKGROUND OF THE INVENTION

1. Field of the Invention

Generally, the present disclosure relates to the manufacture of semiconductor devices, and, more specifically, to various novel methods of forming spacers on integrated circuit (IC) products comprised of FinFET devices.

2. Description of the Related Art

In modern integrated circuits, such as microprocessors, storage devices and the like, a very large number of circuit elements, especially transistors, are provided on a restricted chip area. Transistors come in a variety of shapes and forms, e.g., planar transistors, FinFET transistors, nanowire devices, etc. The transistors are typically either NMOS (NFET) or PMOS (PFET) type devices wherein the "N" and "P" designation is based upon the type of dopants used to create the source/drain regions of the devices. So-called CMOS (Complementary Metal Oxide Semiconductor) technology or products refers to integrated circuit products that are manufactured using both NMOS and PMOS transistor devices. Irrespective of the physical configuration of the transistor device, each device comprises drain and source regions and a gate electrode structure positioned above and between the source/drain regions. Upon application of an appropriate control voltage to the gate electrode, a conductive channel region forms between the drain region and the source region.

In contrast to a planar FET, which, as the name implies, is a generally planar structure, a so-called FinFET device has a three-dimensional (3D) structure. FIG. 1A is a perspective view of an illustrative prior art FinFET semiconductor device 10 that is formed above a semiconductor substrate 12 that will be referenced so as to explain, at a very high level, some basic features of a FinFET device. In this example, the FinFET device 10 includes three illustrative fins 14, a gate insulating layer 11, a gate electrode 16, a sidewall spacer 18 and a gate cap 20. A plurality of fin-formation trenches 22 is formed in the substrate 12 to define the fins 14. A recessed layer of insulating material 13 is positioned between the fins 14 and under the gate electrode 16. The overall gate structure is typically comprised of the layer of gate insulating material 11, e.g., a layer of high-k insulating material (k-value of 10 or greater) or silicon dioxide, and one or more conductive material layers (e.g., metal and/or polysilicon) that serve as the gate electrode 16 for the device 10. The fins 14 have a three-dimensional configuration: a height H, a width W and an axial length L. The axial length L corresponds to the direction of current travel in the device 10 when it is operational, i.e., the gate length (GL) direction of the device 10. Also depicted is the gate width (GW) direction of the device which is transvers to the gate length direction of the device 10. The portions of the fins 14 covered by the gate structure constitute the channel region of the FinFET device 10. The gate structures for such FinFET devices 10 may be manufactured using so-called "gate-first" or "replacement gate" (gate-last) manufacturing techniques. A FinFET device may have either a tri-gate or dual-gate channel region.

FIGS. 1B-1D are drawings that depict cross-sectional views of the device 10 at various locations so as to explain some problems that may be encountered when forming spacers on FinFET devices using prior art techniques. These drawings include a simplistic plan view of the device 10 (in the upper right corner) that depicts the location where various cross-sectional views depicted in these drawings are taken. More specifically, the view "X-X" is a cross-sectional view taken through an active gate structure (in the gate-width direction) that was formed above the illustrative fins. The view Y-Y is a cross-sectional view taken through a source/drain region of a device 10, i.e., at a location between adjacent gate structures and in a direction that is parallel to the gate width (GW) direction of the device 10. The view "Z-Z" is a cross-sectional view that is taken through the long axis of a fin transverse to the long axis of the gate structures in a direction that corresponds to the current transport or gate length (GL) direction of the devices. Other views are taken where indicated in the attached drawings.

FIG. 1B depicts the product at a point in fabrication wherein four illustrative gate structures 21 were formed above the fins 14. As depicted, the gate insulation layer 11, the gate electrodes 16 and the gate caps 20 have been formed using known techniques.

The next major process operation involves formation of the spacer 18 so as to encapsulate and protect the gate structure. Accordingly, FIG. 1C depicts the product after a layer of spacer material 17 was formed across the entire substrate by performing a conformal deposition process. The layer of spacer material 17 may be comprised of material such as silicon nitride and its thickness may vary. However, it should be noted that as device and overall product dimensions continue to shrink, obtaining a properly formed layer of spacer material is a significant challenge. More specifically, and with reference to FIG. 1B, as the gate pitch 25 on integrated circuit products continues to increase, the space or opening 23 between adjacent gate structures 21 becomes small. Accordingly, all other things being equal, as the aspect ratio of the opening 23 increases, i.e., a ratio of the opening depth 23D to the opening width 23 W, it becomes more difficult to properly fill (i.e., with uniform coverage and thickness) the openings 23 with the layer of spacer material 17.

FIG. 1D depicts the product after one or more anisotropic etching processes were performed to etch the layer of spacer material 17 and thereby define the spacer 18 adjacent the gate structures 21. In an ideal situation, the spacer 18 has an upper surface 18S that is approximately level with the upper surface 20S of the gate cap 20. As depicted, in forming the spacer 18 adjacent the gate structures 21, portions of the layer of spacer material 17 are also removed in the source/drain regions of the devices. That is, at least a portion 26 of the fins 14 in the source/drain regions are exposed after the spacer etch process. After the formation of the spacer 18 adjacent the gate structures 21, the normal process flow would include growing epi semiconductor material 27 (shown in dashed lines in FIG. 1D) on the exposed portions of the fins 14 in the source/drain regions.

With continuing reference to FIG. 1D, one problem that occurs is that, in some cases, the size of the exposed portion of the fins 14 in the source/drain regions is very small, e.g., the dimension 26 may be on the order of about 10-30 nm. Stated another way, too much of the layer of spacer material 17 remains positioned adjacent the fins 14 in the source/drain region at the completion of the formation of the spacer 18 adjacent the gate structures 21. Due to the limited size of the exposed portion of the fins 14, the size of the epi semiconductor material 27 may be less than would otherwise be desired, thereby perhaps resulting in less than preferred device performance. One possible solution would be to simply increase the duration of the spacer etch process so as to insure that the spacer material is removed from the fins 14 in the source/drain regions. But, one risk to this approach would be consuming too much of the spacer 18 adjacent the gate structures 21, i.e., there would be too much "pull-down" (a decrease in overall height) of the spacer 18. In a worst case scenario, if there is too much pull-down of the spacer 18, portions of the gate electrode 16 may be exposed and subject to later attack in later processing operations. One way to counter-act this potential for excessive pull-down of the spacer 18 is to make the gate cap 20 thicker, e.g., with an upper surface 20X, which, in turn, would effectively increase the overall idealized height of this taller spacer 18A (shown in dashed lines), with an upper spacer 18X. By making the extra tall spacer 18A, the duration of the spacer etch process could be increased in an effort to remove significantly more or all of the layer of spacer material 17 from adjacent the fins 14 in the source/drain regions so that more of the fin is exposed for formation of the epi material 27. For example, the spacer etch process could be performed until such time as the extra tall spacer 18A has an upper surface 18Y that is positioned slightly above the upper surface 16S of the gate electrode 16. Unfortunately, this proposed "solution" would only further increase the aspect ratio of the space 23 between adjacent gate structures 21, thereby making the filling of the spaces 23 with the layer of spacer material 17 even more challenging.

The present disclosure is directed to methods of forming spacers on integrated circuit (IC) products comprised of FinFET devices that may solve or reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various novel methods of forming spacers on FinFET devices. One illustrative method disclosed herein includes, among other things, forming a layer of spacer material above a gate structure and above a fin, forming a liner layer above the layer of spacer material, the liner layer having a first portion positioned around the gate structure and a second portion positioned around the fin, and forming an ion-containing region in at least a portion of the first portion of the liner layer while not forming the ion-containing region in the second portion of the liner layer. In this embodiment, the method further includes performing a liner etching process on the first and second portions of the liner layer so as to remove the second portion of the liner layer while leaving at least a portion of the first portion of the liner layer positioned adjacent the gate structure and, with the first portion of the liner layer positioned adjacent the gate structure, performing at least one spacer formation anisotropic etching process on the layer of spacer material so as to define a spacer adjacent the gate structure.

BRIEF DESCRIPTION OF THE DRAWINGS

The disclosure may be understood by reference to the following description taken in conjunction with the accompanying drawings, in which like reference numerals identify like elements, and in which:

FIGS. 2A-2J depict various illustrative novel methods disclosed herein for forming spacers on FinFET devices.

Figure 1A:
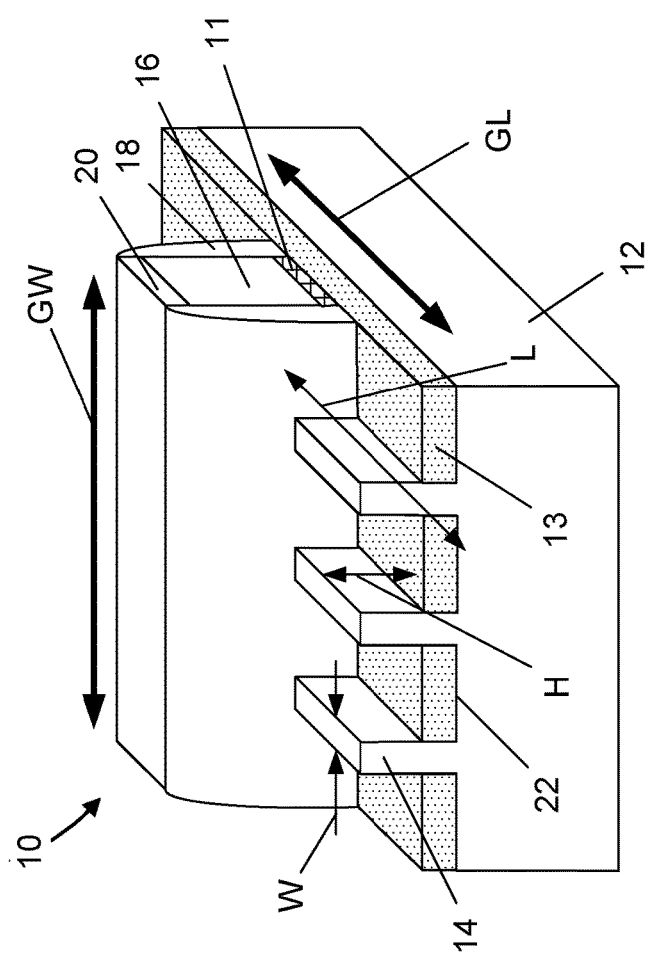
FIGS. 1A-1D depict an illustrative prior art FinFET device and an illustrative prior art method form forming a spacer on such a FinFET device.
Figure 1B:
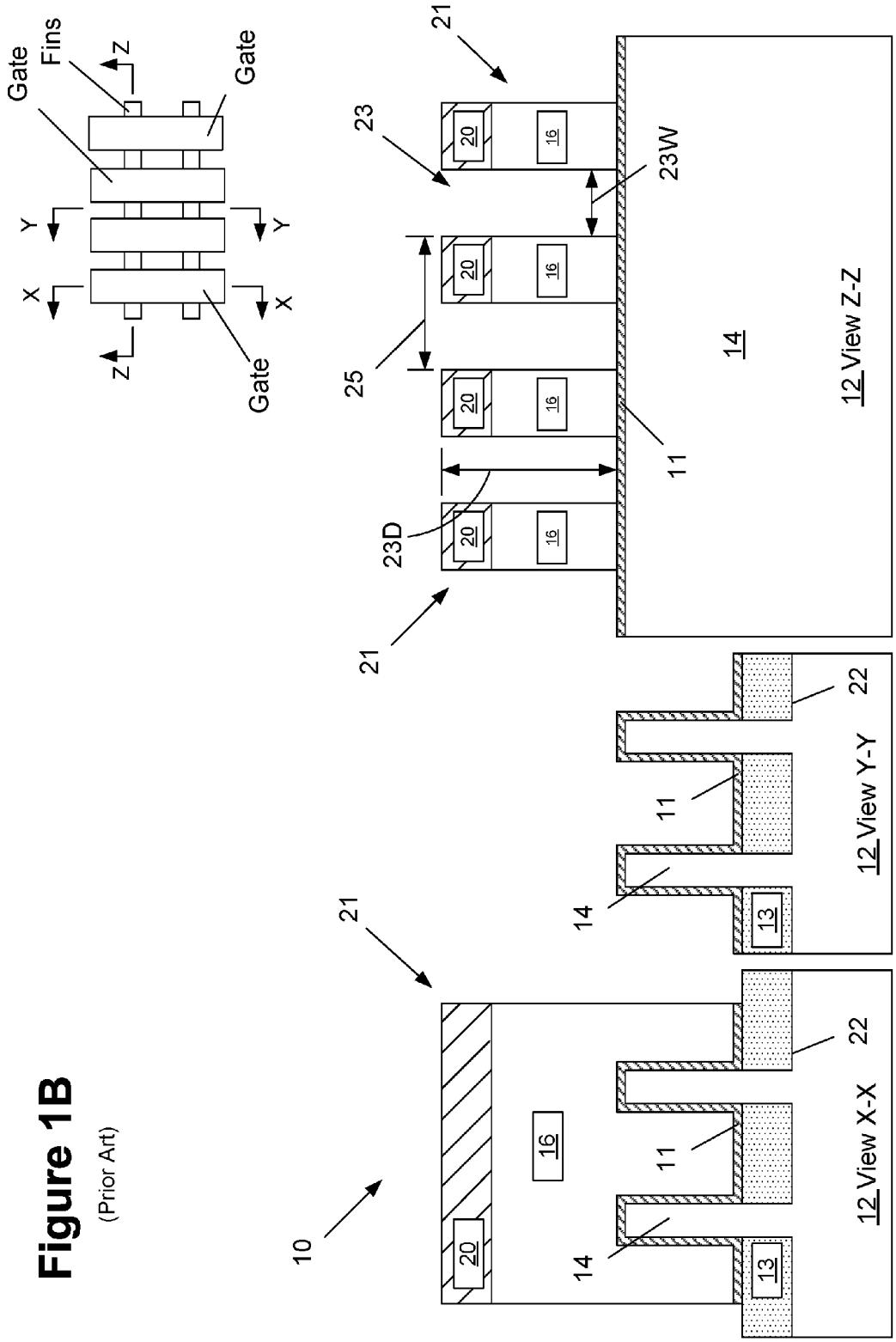

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase. As will be readily apparent to those skilled in the art upon a complete reading of the present application, the methods disclosed herein may be employed in manufacturing a variety of different devices, including, but not limited to, logic devices, memory devices, etc., and the devices may be may be either NMOS or PMOS devices.

As will be appreciated by those skilled in the art after a complete reading of the present application, various doped regions, e.g., source/drain regions, halo implant regions, well regions and the like, are not depicted in the attached drawings. Of course, the inventions disclosed herein should not be considered to be limited to the illustrative examples depicted and described herein. The various components and structures of the integrated circuit devices 100 disclosed herein may be formed using a variety of different materials and by performing a variety of known techniques, e.g., a chemical vapor deposition (CVD) process, an atomic layer deposition (ALD) process, a thermal growth process, spin-coating techniques, etc. The thicknesses of these various layers of material may also vary depending upon the particular application. With reference to the attached figures, various illustrative embodiments of the methods and devices disclosed herein will now be described in more detail.

FIGS. 2A-2J present various views of one illustrative embodiment of a method of forming spacers on FinFET devices 100 on an integrated circuit (IC) product comprising such FinFET devices. These drawings depict various cross-sectional views of the device 100 taken at various locations during the fabrication process so as to explain some aspects of the various methods disclosed herein. The device 100 shown in these drawings only depicts a single gate structure 21 and only two fins 14 so as to not overly complicate the drawings. Of course, a real-world IC product may contain any number of gate structures 21 and fins 14. These drawings also include a simplistic plan view of the device 100 (in the upper right corner) that depicts the location where the various cross-sectional views depicted in these drawings are taken. More specifically, the view "X-X" is a cross-sectional view taken through an active gate structure 21 (in the gate-width direction) that was formed above the illustrative fins 14. The view Y-Y is a cross-sectional view taken through a source/drain region of a device 100, i.e., at a location between adjacent gate structures (not shown) and in a direction that is parallel to the gate width direction (GW) of the device 100. The view "Z-Z" is a cross-sectional view that is taken through the long axis of a fin 14 transverse to the long axis of the gate structure 21 in a direction that corresponds to the current transport or gate length (GL) direction of the device 100. Other views are taken where indicated in the attached drawings. The illustrative gate structure 21 may be either a final gate structure for the device 100 or it may be a sacrificial gate structure for the device 100.

The overall size, shape and configuration of the fins 14 may vary depending on the particular application. In the illustrative examples depicted in the attached figures, the fins 14 will be simplistically depicted as having generally rectangular portions and sections. In an actual real-world device, the fins 14 may be somewhat outwardly tapered (wider at a bottom of the fin 14 that at the top of the fin 14), although that configuration is not depicted in the drawings. Thus, the size and configuration of the fins 14, and the manner in which they are made, should not be considered a limitation of the present invention. For ease of disclosure, only the substantially rectangular-shaped fins 14 having a substantially rectangular-shaped cross-sectional configuration will be depicted in the drawings.

In the examples depicted herein, the FinFET device 100 will be formed in and above a semiconductor substrate 12. The substrate 12 may have a variety of configurations, such as a silicon-on-insulator (SOI) or silicon-germanium-on-insulator (SGOI) that includes a bulk semiconductor layer, a buried insulation layer and an active layer. Alternatively, the substrate may have a simple bulk configuration. The substrate 12 may be made of silicon or it may be made of materials other than silicon. Thus, the terms "substrate" or "semiconductor substrate" should be understood to cover all semiconducting materials and all forms of such materials.

Figure 1C:
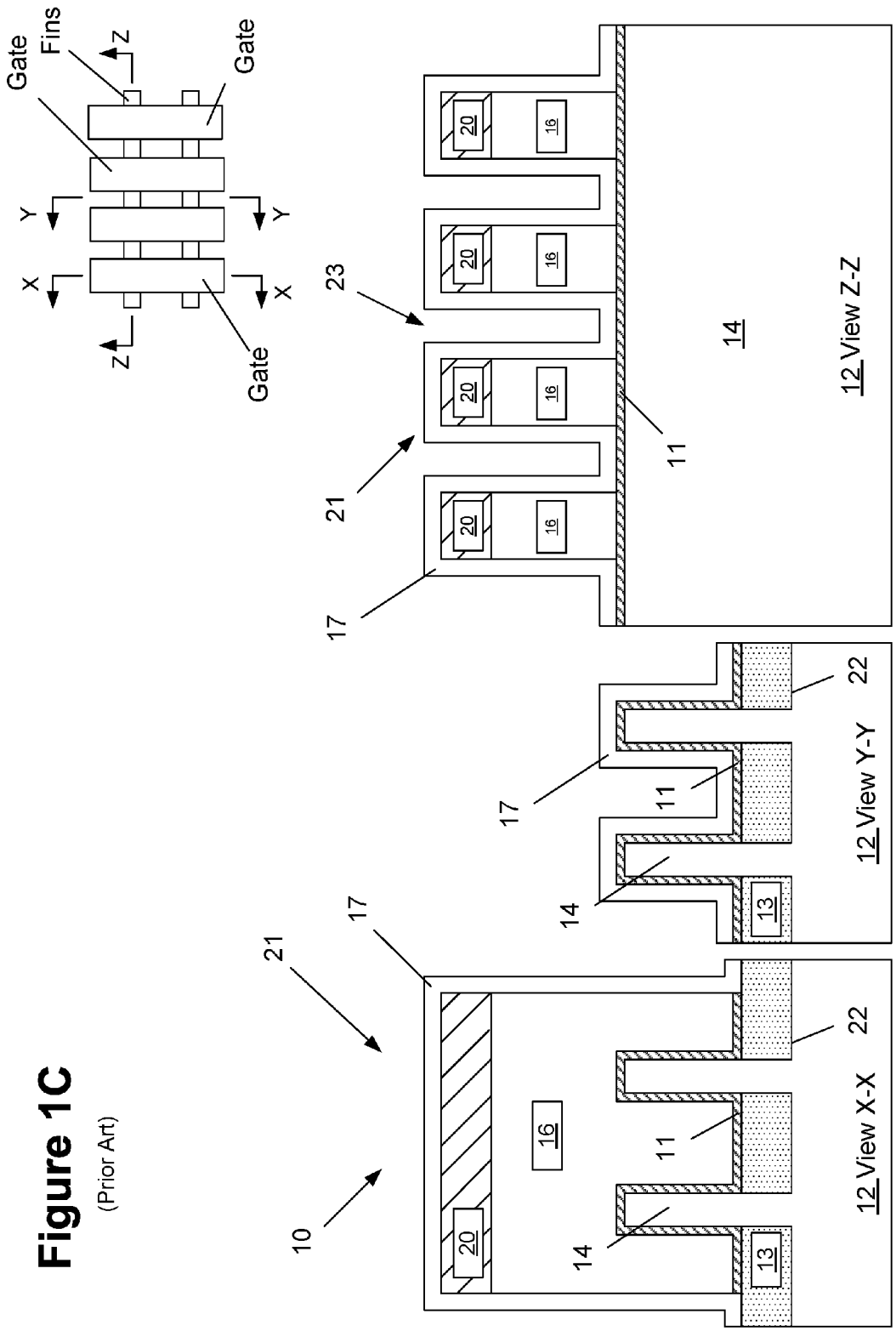
Figure 1D:
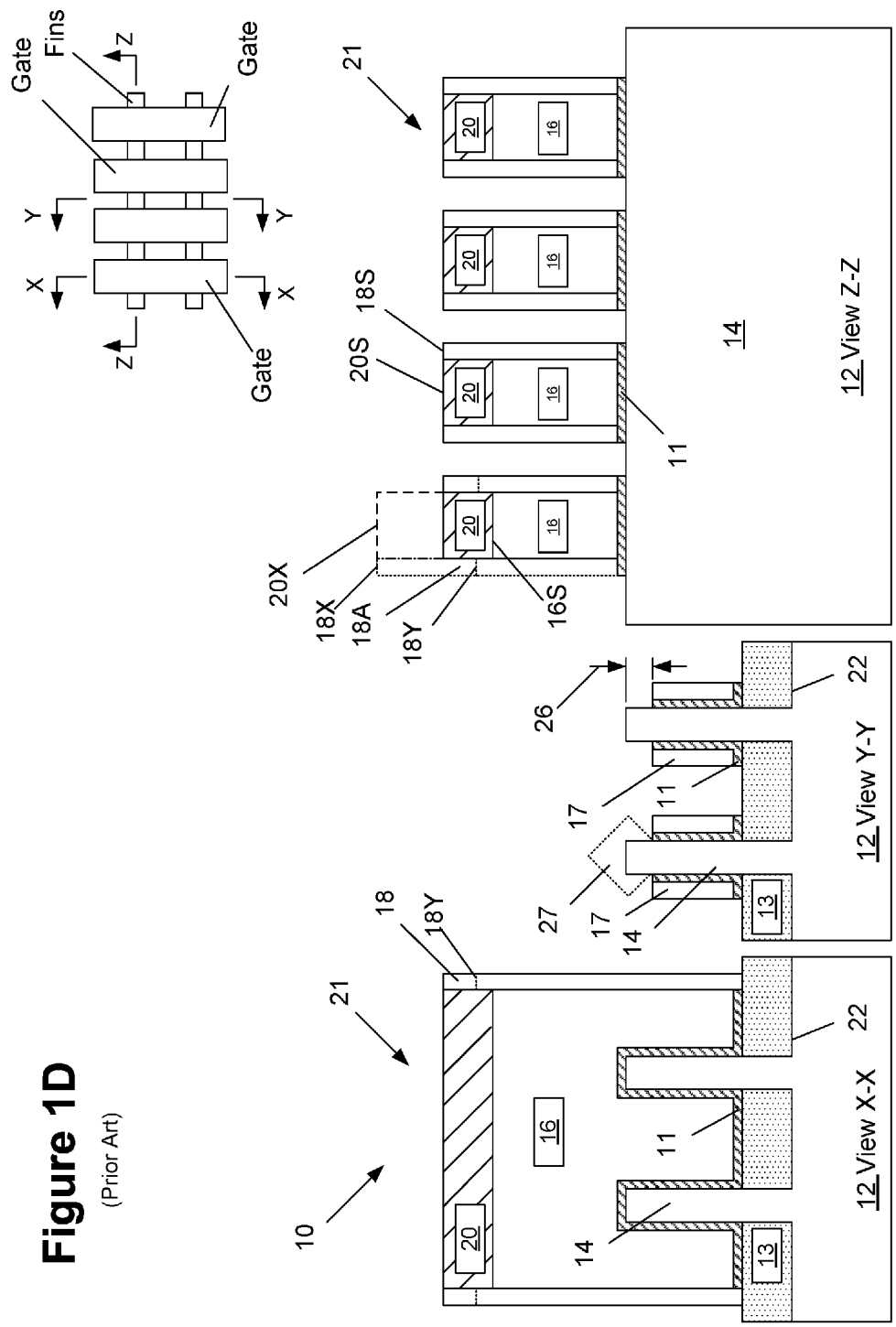
Figure 2A:
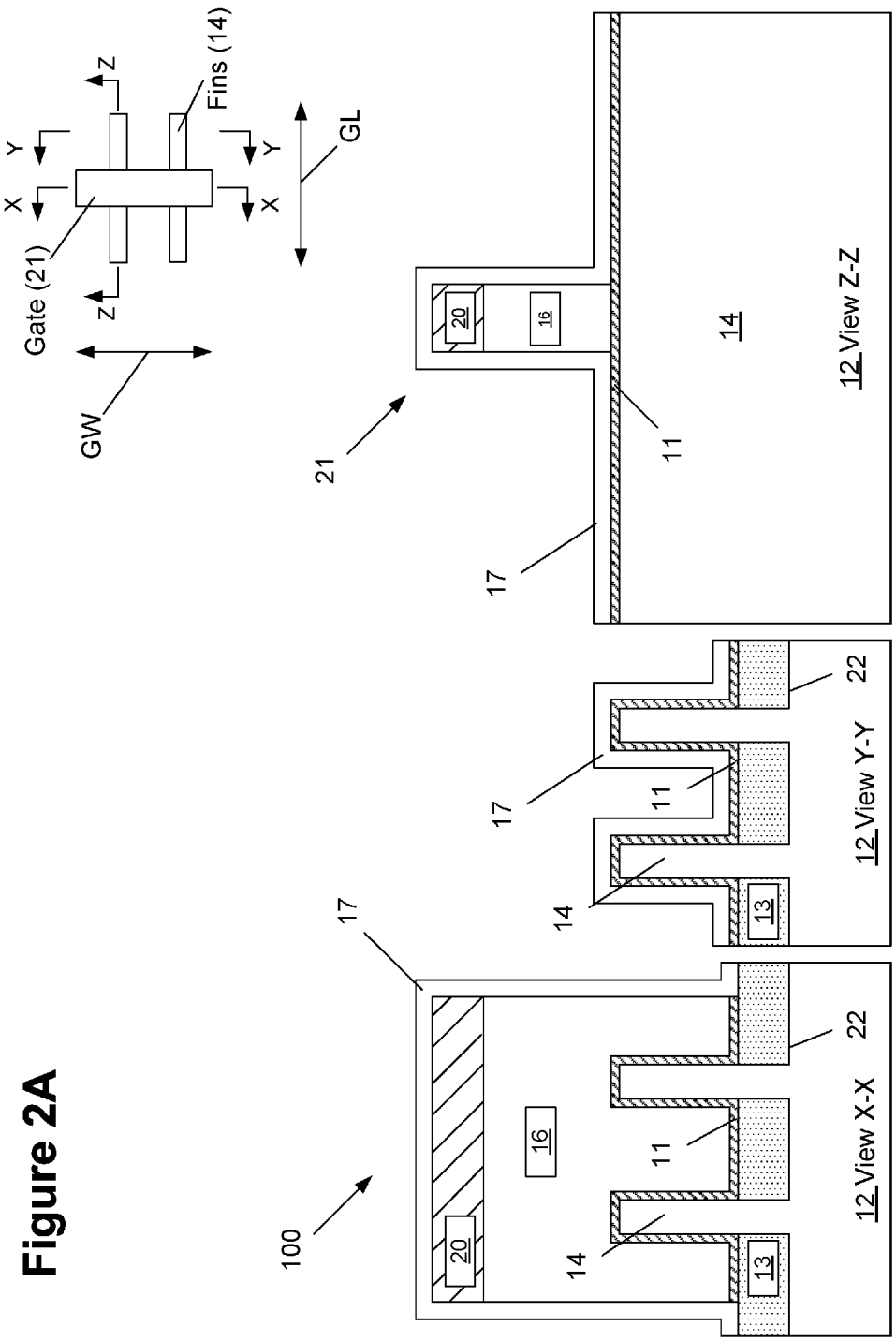

FIG. 2A depicts the device 100 at a point in fabrication that corresponds to the point of fabrication depicted in FIG. 1C. More specifically, the above-described gate structure 21 was formed above the fins 14, and a layer of spacer material 17 was formed across the substrate 12 by performing a conformal deposition process. The layer of spacer material 17 is thus positioned around the fins 14 and around the gate structure 21. The layer of spacer material 17 may be made of any desired material, e.g., silicon nitride, a low-k material (e.g., a material having a k value of less than 3.5), and it may be formed to any desired thickness, e.g., 3-15 nm. The layer of spacer material 17 may be formed by performing, for example, a conformal ALD process.

Figure 2B:
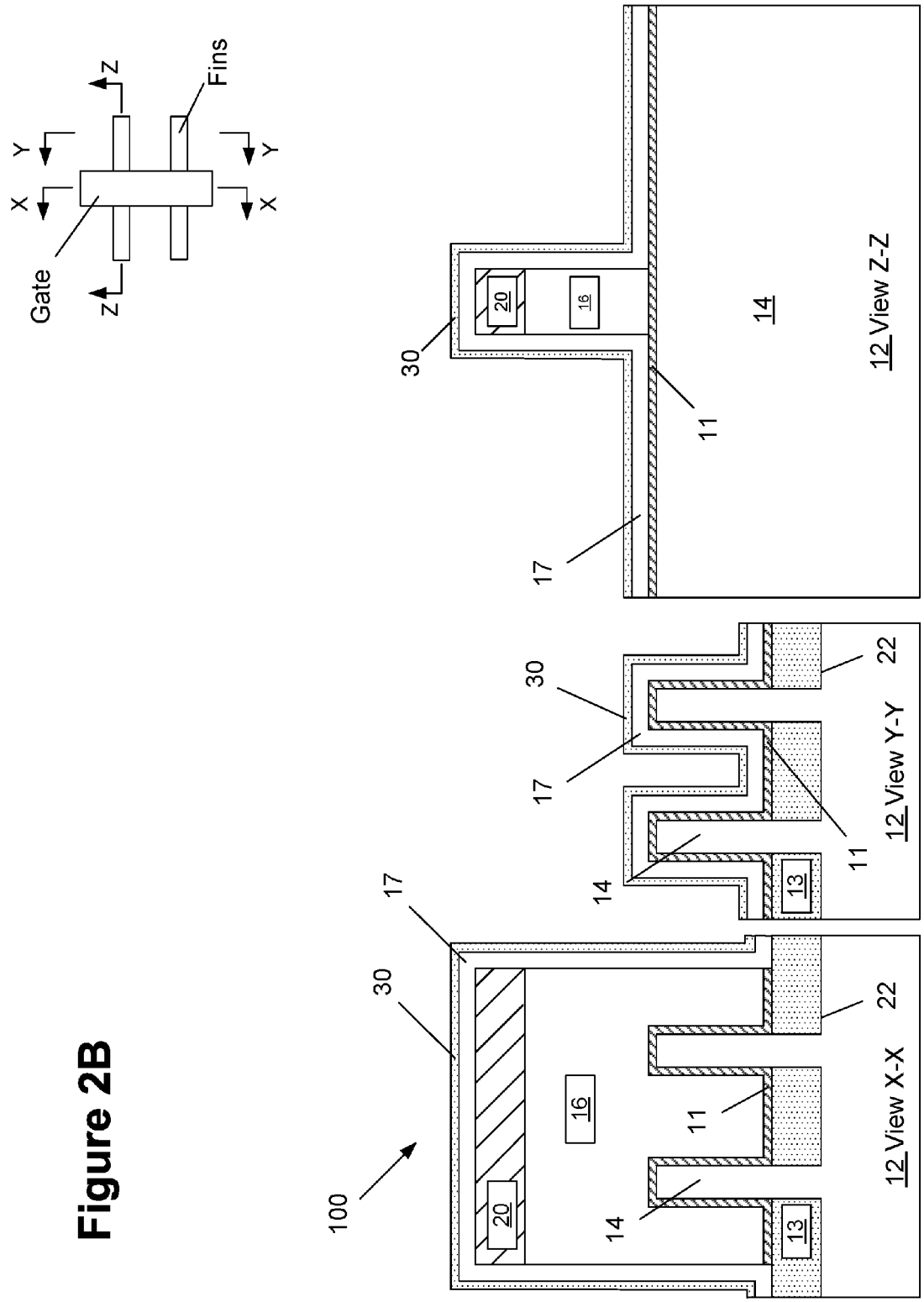

FIG. 2B depicts the device 100 after an optional relatively thin liner layer 30 was formed above the device 100 depicted in FIG. 2A by performing a conformal deposition process, e.g., ALD, CVD. In one illustrative embodiment, the liner layer 30 may be comprised of a variety of different materials, e.g., silicon dioxide, silicon nitride, silicon oxynitride, etc. The thickness of the liner layer 30 may vary depending upon the particular application, e.g., 2-10 nm. It should be noted that the formation of the liner layer 30 may not be required in all applications.

Figure 2C:
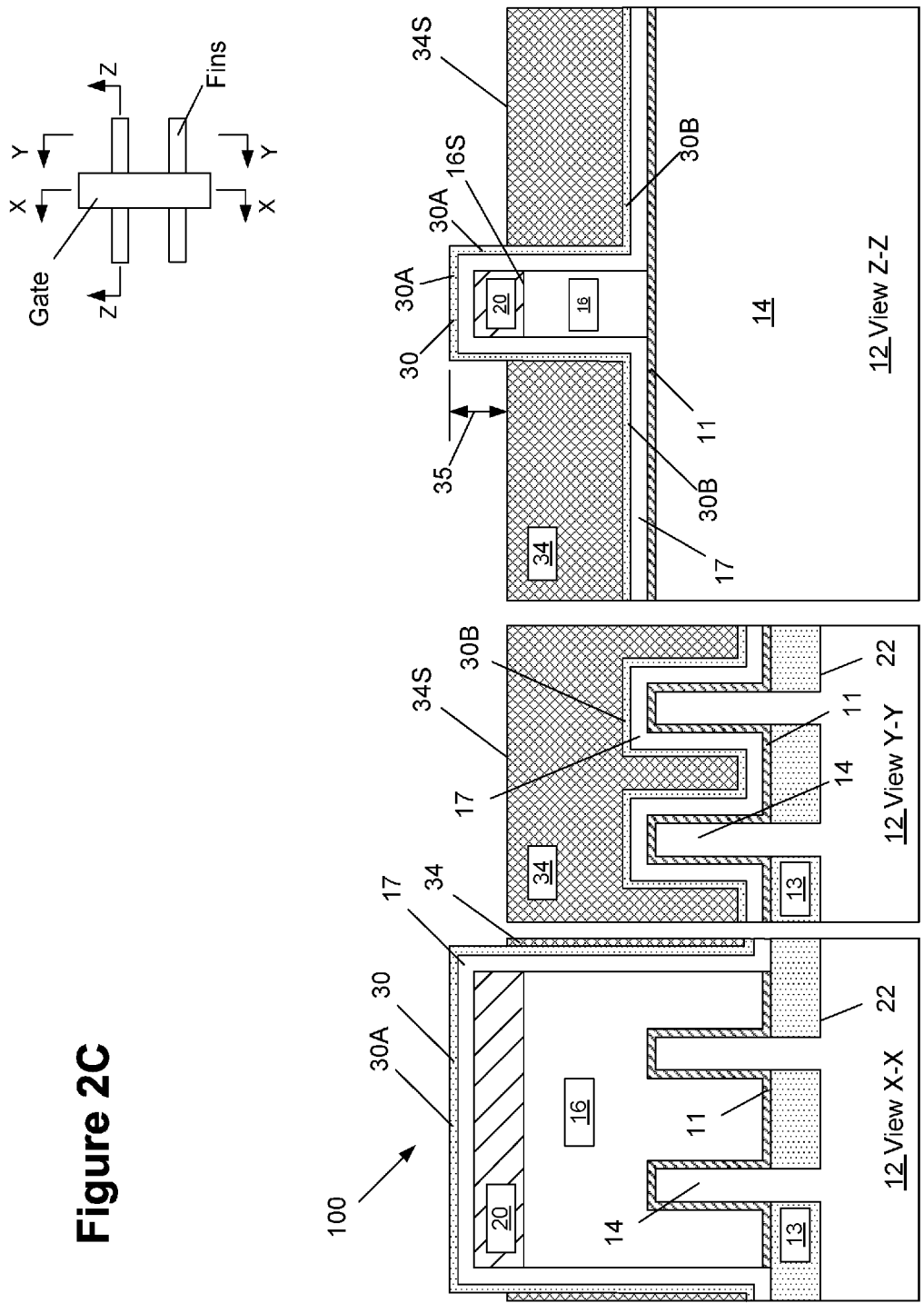

FIG. 2C depicts the device 100 after several process operations were performed to form a recessed masking layer 34 on the device 100. The masking layer 34 exposes a first portion 30A of the liner layer 30 while masking a second portion 30B of the liner layer 30. The recessed masking layer 34 may be made of a variety of different materials, e.g., a spin-on hard mask (SOH), OPL, photoresist, or a hard mask material that may be selectively etched relative to the material of the liner layer 30, and it may be formed by performing a variety of processing techniques. In one particular embodiment, where the recessed masking layer 34 is made of SOH material, the recessed masking layer 34 may be formed by initially over-filling the trenches 22 and covering the gate structure 21 with the masking layer material and performing a timed recess etching process so as to define the recessed masking layer 34 with the upper surface 34S. In some applications, the timed recess etching process may be omitted, i.e., it may be possible to initially form the recessed masking layer 34 such that the upper surface 34S is an as-deposited surface of the recessed masking layer 34. In general, the upper surface 34S of the recessed masking layer 34 should be positioned at a level that is above a level of the upper surface 16S of the gate electrode 16 of the gate structure 21. The magnitude of this difference in height levels may vary depending upon the particular application. As depicted, the upper surface 34S is positioned below the upper surface of the liner layer 30 by a distance 35 that may vary depending on the application, e.g., 5-50 nm. Also note that a portion of the liner layer 30, the layer of spacer material 17 and the gate cap 20, are positioned above the level defined by the upper surface 34S.

Figure 2D:
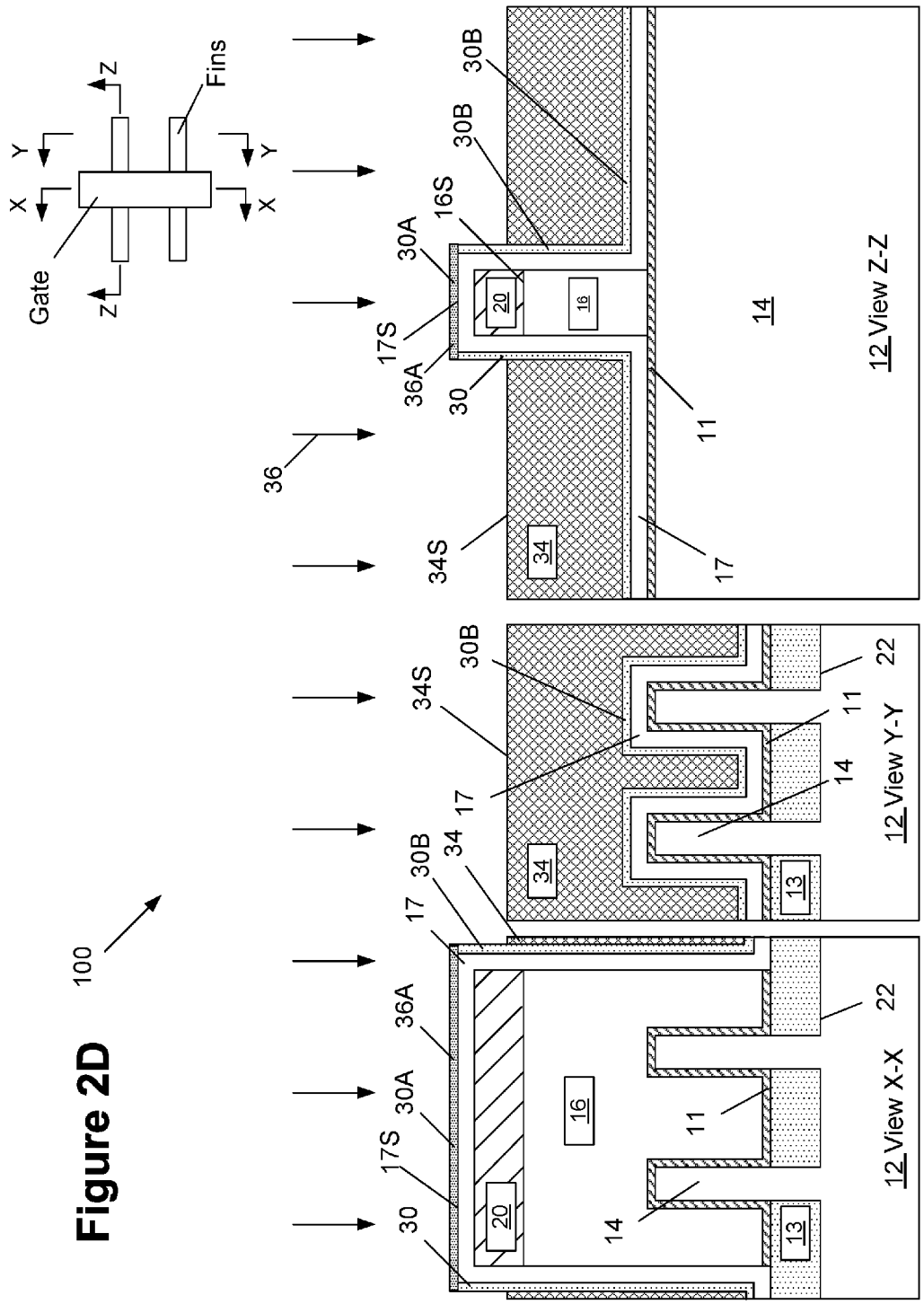

FIG. 2D depicts the device 100 after an ion-introduction process operation 36 was performed on the device 100 to introduce ions into the first portion 30A of the liner layer 30 so as to form an ion-containing region 36A in the first portion 30A of the liner layer 30 while not forming the ion-containing region 36A in the second portion 30B of the liner layer 30. The ion-introduction process operation 36 may be either an ion-implant process or a plasma-based process. The ions introduced during the ion-introduction process 36 may vary depending upon the particular applications, e.g., silicon, carbon, germanium, fluorine, chlorine, etc., and the concentration of ions in the ion-containing region 36A may also vary depending upon the particular application, e.g., $4e^2$ ion/cm$^3$. The ultimate purpose of forming the ion-containing region 36A is to alter or change the etching characteristics of the first portion 30A of the liner layer 30. More specifically, by selectively forming the ion-containing region 36A only in the first portion 30A of the liner layer 30, the first portion 30A of the liner layer 30 will etch at a slower rate than that of the second portion 30B of the liner layer 30. Note that, with reference to the view Y-Y, the second portion 30B of the liner layer 30 in the source/drain region is covered by the recessed masking layer 34 during the ion-introduction process operation 36.

In the example depicted in FIG. 2D, the ion-introduction process operation 36 is a substantially vertical ion implantation process that was performed to form the ion-containing region 36A in the first portion 30A of the liner 30 through a patterned implant mask layer (not shown). Any ions that might be implanted into the recessed masking layer 34 during the ion implantation process are not depicted so as to not obscure the inventions disclosed herein. In one illustrative example, depending upon factors such as the thickness of the liner layer 30, the ion implantation process may be performed using silicon at a dopant dose of about $1 \times 10^{16}$ ions/cm$^2$ and at an energy level of about 0.2-2 keV. In this illustrative example, the ion implantation process was designed such that the ion-containing region 36A penetrated the entire thickness of the first portion 30A of the liner 30. However, the ion-containing region 36A need not extend through the entire thickness of the first portion 30A of the liner 30 in all applications. In this illustrative example, the first portion 30A (with the ion-containing region 36A) is only formed above the substantially horizontal surface 17S of the layer of spacer material 17.

Figure 2E:
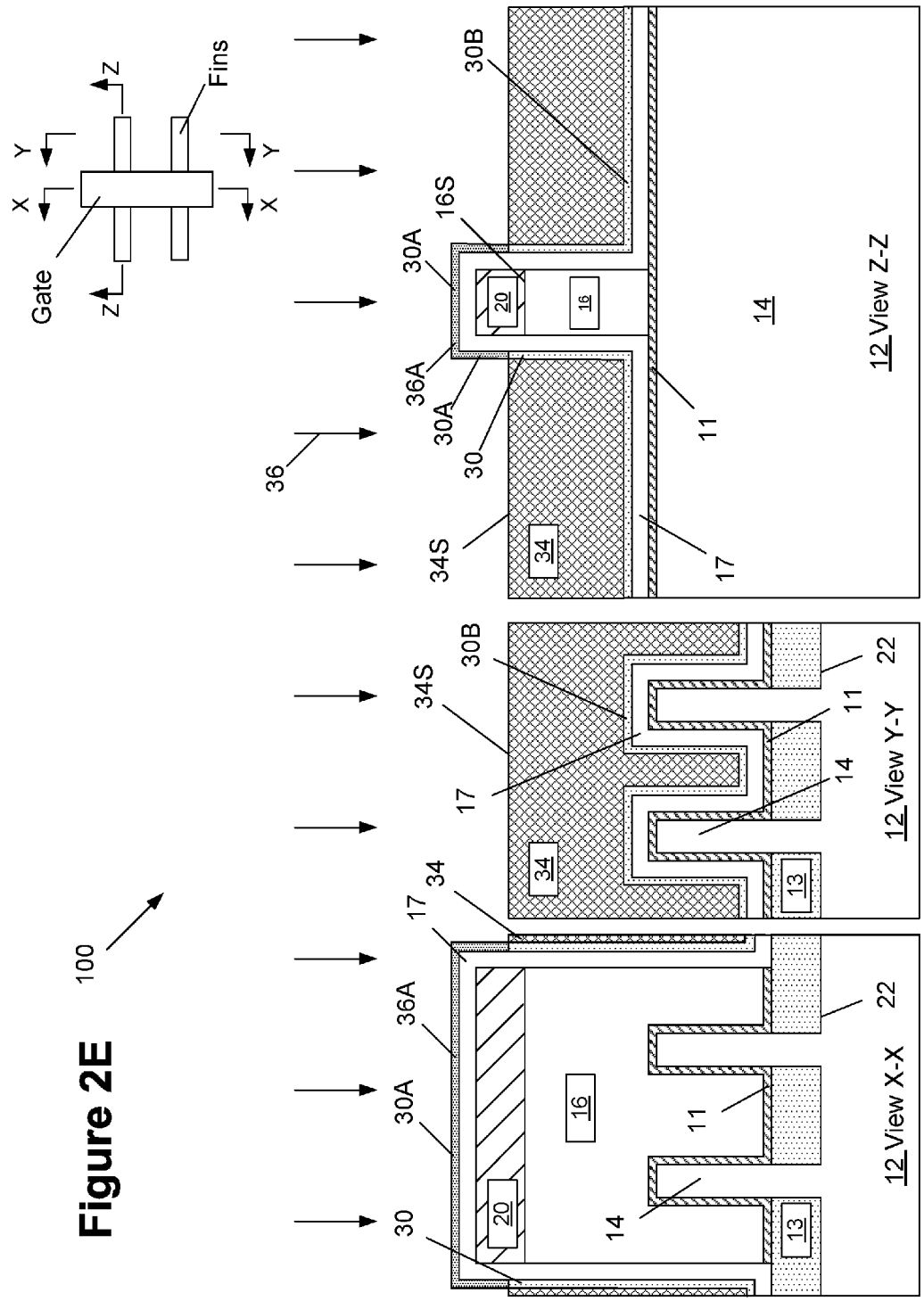

FIG. 2E depicts the device 100 wherein the ion-introduction process operation 36 is a plasma-based ion introduction process that is performed to form the ion-containing region 36A in the first portion 30A of the liner 30. As depicted, in this example, the ion-containing region 36A formed in the exposed first portion 30A of the liner layer 30 wraps around the gate structure 21, i.e., all of the first portion 30A of the liner layer 30 proximate the top and opposite side surfaces of the gate cap 20. Any introductions of ions into the recessed masking layer 34 during the plasma-based ion introduction process is not depicted so as to not obscure the inventions disclosed herein. Depending upon factors such as the thickness of the liner layer 30, the duration, temperature and energy of the plasma-based ion introduction process may vary. As before, in the depicted example, the plasma-based ion introduction process was designed such that the ion-containing region 36A in the first portion 30A penetrated the entire thickness of the liner layer 30. However, as noted above, the ion-containing region 36A in the first portion 30A need not extend through the entire thickness of the liner layer 30 in all applications. In this illustrative example, the first portion 30A (with the ion-containing region 36A) has a generally inverted U-shaped configuration in the cross-sectional view shown in view Z-Z.

Figure 2F:
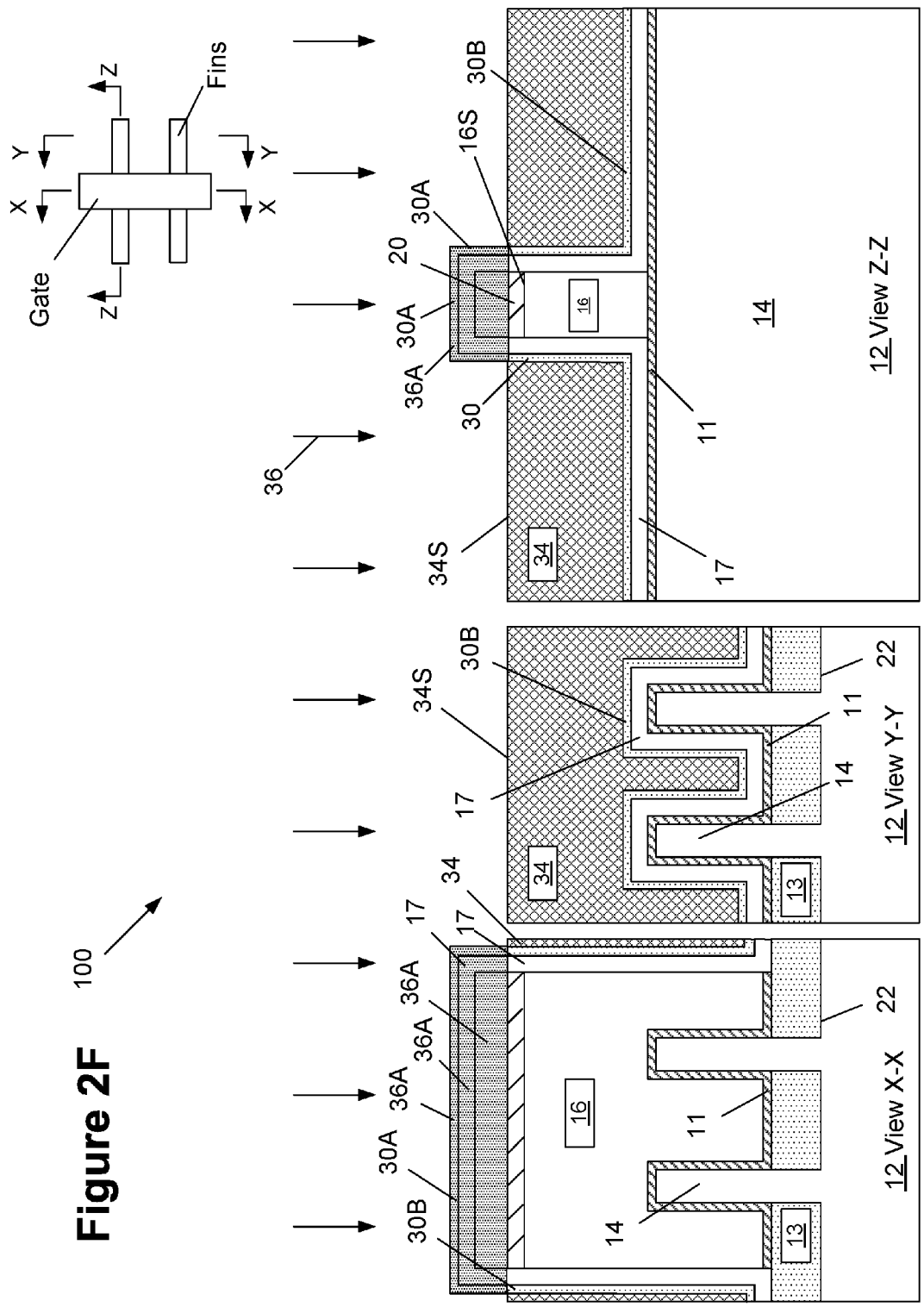

FIG. 2F depicts an alternative embodiment wherein the ion-introduction process operation 36, in the form of either an ion implantation process or a plasma-based ion introduction process, is performed for a sufficient duration such that the ion-containing region 36A extends throughout the first portion 30A of the liner layer 30 and throughout the materials positioned above the upper surface 34S of the recessed masking layer 34. Of course, if desired, the ion-introduction process operation 36 may be performed such that the overall depth of the ion-containing region 36A does not extend all the way to the upper surface 34S and/or not all the way laterally across the layer of spacer material 17 or the gate cap 20. For example, the ion-introduction process operation 36 may be performed such that the overall depth of the ion-containing region 36A extends only partially into the layer of spacer material 17, or throughout the entire thickness of the layer of spacer material 17, or throughout the layer of spacer material 17 and partially into the gate cap 20. In general, the depth of the ion-containing region 36A should be controlled so that the ion-containing region 36A does not extend into the gate electrode 16. As before, any introduction of ions into the recessed masking layer 34 during the ion-introduction process operation 36 is not depicted in the drawings. For purposes of the remaining discussion, reference will be made to the embodiment shown in FIG. 2D.

Figure 2G:
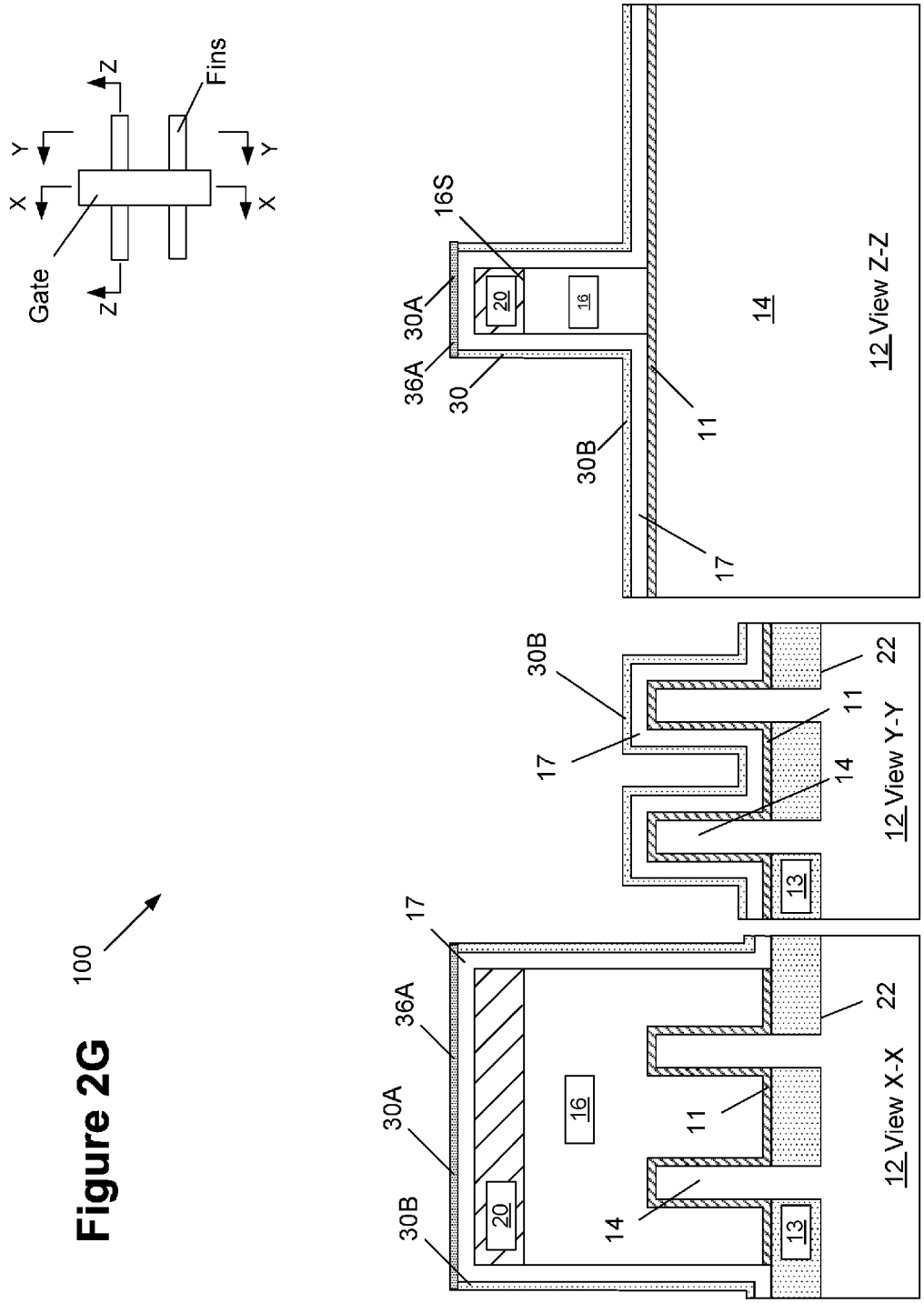

FIG. 2G depicts the device 100 after the recessed masking layer 34 was removed by performing any of a variety of techniques depending upon the material of the recessed masking layer 34, e.g., chemical stripping, etching, etc. In the example wherein the recessed masking layer 34 is made of SOH, a chemical stripping process is performed to remove the recessed masking layer 34.

FIG. 2H depicts the device 100 after a liner etching process was performed on the liner layer 30. In one example, where the liner layer 30 is made of silicon dioxide, the etching process may be a dilute HF acid cleaning process. Importantly, the liner etching process removes the second portion 30B of the liner layer 30 (which does not contain the ion-containing region 36A) at a faster rate than it removes the first portion 30A of the liner layer 30 (that does contain the ion-containing region 36A). Although it may vary depending upon a variety of factors, e.g., materials and the concentration of ions in the ion-containing region 36A, the first portion 30A of the liner layer 30 may etch at a rate that is at least about 4000-5000% slower than that of the second portion 30B of the liner layer 30, e.g., if the second portion 30B of the liner layer 30 etches at a rate of 5 Å/sec, the first portion 30A of the liner layer 30 may have an etch rate on the order of about 0.1 Å/sec. As a result of this etch-differential, after this liner etching process is performed, at least a portion of the first portion 30A of the liner layer 30 (with the ion-containing region 36A) remains positioned above at least the upper surface of the layer of spacer material 17 positioned above the gate structure 21, while the second portion 30B of the liner layer 30 located in the source/drain regions of the device 100 (see view Y-Y) has been removed, and the layer of spacer material 17 in the source/drain regions around the fins 14 is exposed.

FIG. 2I depicts the device 100 after at least one anisotropic spacer-formation etching process was performed on the layer of spacer material 17 so as to form a spacer 17S adjacent the gate structure 21 while clearing significant amounts, if not all, of the layer of spacer material 17 from the source/drain areas of the device 100. The presence of the first portion 30A of the liner layer 30 (with the ion-containing region 36A therein) above the gate structure 21 (see FIG. 2H) during spacer-formation etching process serves to protect the underlying portions of the layer of spacer material 17, to at least some degree, from the etching process for at least some period of time. In contrast, the second portion 30B of the layer of spacer material 17 is immediately subjected to the spacer-formation etching process. Thus, while the first portion 30A of the liner layer 30 will be removed during the spacer-formation etching process, the presence of the first portion 30A during the spacer etching process will delay the etching of the layer of spacer material 17 adjacent the gate structure 21. As a result, more of the layer of spacer material 17 in the source/drain regions of the device may be removed without causing an unacceptable reduction in overall height in the spacer 17S, thereby insuring adequate protection for the gate structure 21 and making more of the surface of the fins 14 in the source/drain region available for formation of epi material.

FIG. 2J depicts the device 100 after simplistically depicted epi semiconductor material 40 was grown on the portions of the fins 14 positioned in the source/drain regions of the device 100, i.e., on the portions of the fins 14 positioned laterally outside of the spacer 17S. The epi material 40 may be formed by performing known epitaxial growth processes. At the point of processing depicted in FIG. 2J, traditional manufacturing techniques may be performed to complete the formation of the device 100.

As will be appreciated by those skilled in the art after a complete reading of the present application, the novel methods disclosed herein provide a means by which significant amounts, if not all, of any spacer material may be removed from the source/drain regions of the device while preventing unacceptable levels of spacer pull-down of the spacer 17S adjacent the gate structure 21 without increasing the aspect ratio of the space between adjacent gate structures, as was the case with the prior art method disclosed in the background section of this application.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of forming a spacer for a FinFET device, comprising:
    forming a layer of spacer material above a gate structure and above a fin;
    forming a liner layer above said layer of spacer material, said liner layer having a first portion positioned around said gate structure and a second portion positioned around said fin;
    forming an ion-containing region in at least a portion of said first portion of said liner layer while not forming said ion-containing region in said second portion of said liner layer;
    performing a liner etching process on said first and second portions of said liner layer so as to remove said second portion of said liner layer while leaving at least a portion of said first portion of said liner layer positioned adjacent said gate structure; and
    with said first portion of said liner layer positioned adjacent said gate structure, performing at least one spacer formation anisotropic etching process on said layer of spacer material so as to define a spacer adjacent said gate structure.

2. The method of claim 1, wherein forming said ion-containing region comprises performing an ion implantation process.

3. The method of claim 1, wherein forming said ion-containing region comprises performing a plasma-based process so as to introduce ions into said first portion of said liner layer.

4. The method of claim 1, wherein forming said ion-containing region comprises forming said ion-containing region such that said ion-containing region has a concentration of introduced ions of about $4e^2$ ion/cm$^3$.

5. The method of claim 4, wherein said introduced ions comprise one of silicon, carbon, germanium, fluorine or chlorine.

6. The method of claim 1, wherein the presence of said ion-containing region in said first portion of said liner layer causes said first portion of said liner layer to have a slower etch rate than that of said second portion of said liner layer.

7. The method of claim 1, wherein forming said ion-containing region in at least a portion of said first portion of said liner layer while not forming said ion-containing region in said second portion of said liner layer comprises:
    forming a masking layer that exposes said first portion of said liner layer while masking said second portion of said liner layer; and
    with said masking layer in position, performing at least one ion introduction process operation to form said ion-containing region in at least a portion of said exposed first portion of said liner layer.

8. The method of claim 1, wherein said first portion of said liner layer is positioned above a top surface and adjacent opposite side surfaces of a gate cap positioned above said gate structure.

9. The method of claim 1, wherein said first portion of said liner layer is positioned only above a substantially planar surface of said layer of spacer material.

10. The method of claim 1, wherein said ion-containing region extends throughout an entire thickness of said first portion of said liner layer.

11. The method of claim 10, wherein said ion-containing region further extends into said layer of spacer material.

12. The method of claim 11, wherein said ion-containing region further extends into a gate cap positioned above said gate structure.

13. The method of claim 12, wherein said gate structure is one of a sacrificial gate structure or a final gate structure for said FinFET device.

14. A method of forming a spacer for a FinFET device, comprising:
    forming a fin in a semiconductor substrate;
    forming a gate structure above said fin;
    forming a layer of spacer material above said gate structure and above said fin;
    forming a liner layer above said layer of spacer material;
    forming a masking layer above said fin and adjacent said gate structure, wherein said masking layer exposes a first portion of said liner layer adjacent said gate structure and masks a second portion of said liner layer positioned above said fin;
    with said masking layer in position above said fin, performing at least one ion introduction process operation to form an ion-containing region in at least a portion of said exposed first portion of said liner layer;
    removing said masking layer;
    performing a liner etching process on said first and second portions of said liner layer so as to remove said second portion of said liner layer while leaving at least a portion of said first portion of said liner layer positioned adjacent said gate structure; and with said first portion of said liner layer positioned adjacent said gate structure, performing at least one spacer formation anisotropic etching process on said layer of spacer material so as to define a spacer adjacent said gate structure.

15. The method of claim 14, wherein performing said at least one ion introduction process operation comprises performing an ion implantation process.

16. The method of claim 14, wherein performing said at least one ion introduction process operation comprises performing a plasma-based process so as to introduce ions into said first portion of said liner layer.

17. The method of claim 15, wherein said ion-containing region has a concentration of introduced ions of about $4e^2$ ion/cm$^3$.

18. The method of claim 17, wherein said introduced ions comprise one of silicon, carbon, germanium, fluorine or chlorine.

19. The method of claim 14, wherein the presence of said ion-containing region in said first portion of said liner layer causes said first portion of said liner layer to have a slower etch rate than that of said second portion of said liner layer.

20. The method of claim 14, wherein said first portion of said liner layer is positioned above a top surface and adjacent opposite side surfaces of a gate cap positioned above said gate structure.

21. The method of claim 14, wherein said first portion of said liner layer is positioned only above a substantially planar surface of said layer of spacer material.

22. The method of claim 14, wherein said ion-containing region extends throughout an entire thickness of said first portion of said liner layer.

23. The method of claim 22, wherein said ion-containing region further extends into said layer of spacer material.

24. The method of claim 23, wherein said ion-containing region further extends into a gate cap positioned above said gate structure.

* * * * *